United States Patent
Lin

(10) Patent No.: US 7,301,489 B2
(45) Date of Patent: *Nov. 27, 2007

(54) DITHERING NOISE CANCELLATION FOR A DELTA-SIGMA MODULATOR

(75) Inventor: Chia-Liang Lin, Union City, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 10 days.

This patent is subject to a terminal disclaimer.

(21) Appl. No.: 11/294,734

(22) Filed: Dec. 6, 2005

(65) Prior Publication Data

US 2007/0090980 A1    Apr. 26, 2007

Related U.S. Application Data

(63) Continuation of application No. 11/255,792, filed on Oct. 21, 2005.

(51) Int. Cl.
*H03M 1/20* (2006.01)
(52) U.S. Cl. ........................... 341/131; 341/143
(58) Field of Classification Search ................ 341/143, 341/155, 131; 348/396.1
See application file for complete search history.

(56) References Cited

U.S. PATENT DOCUMENTS

| | | | |
|---|---|---|---|
| 4,558,361 A * | 12/1985 | Catros | 348/396.1 |
| 4,751,496 A | 6/1988 | Araki | |
| 4,943,807 A | 7/1990 | Early et al. | |
| 5,012,244 A | 4/1991 | Wellard et al. | |
| 5,729,230 A | 3/1998 | Jensen et al. | |
| 5,889,482 A | 3/1999 | Zarubinsky | |
| 6,016,113 A | 1/2000 | Binder | |
| 6,064,871 A | 5/2000 | Leung | |
| 6,087,969 A | 7/2000 | Stockstad et al. | |

(Continued)

FOREIGN PATENT DOCUMENTS

EP    0084353 A2    7/1983

(Continued)

OTHER PUBLICATIONS

Paton, Susan, et al, "A 70-mW 300-MHz CMOS Continuous-Time SD ADC with 15-MHz Bandwidth and 11 Bits of Resolution," IEEE Journal of Solid-State Circuits, vol. 39, No. 7, Jul. 2004.

(Continued)

*Primary Examiner*—Rexford Barnie
*Assistant Examiner*—Joseph Lauture
(74) *Attorney, Agent, or Firm*—Knobbe, Martens, Olson & Bear LLP

(57) ABSTRACT

In an embodiment, a delta-sigma modulator is constructed from one or more stages of a first order low-pass filter, which has a modest gain compared to the integrator used in other embodiments of delta-sigma modulators. Delta-sigma modulators can be converted into low-pass filter based delta-sigma modulators according to an embodiment of the invention by replacing the ideal integrator building block with a first order low-pass filter and adjusting other loop parameters, such as gain factors, accordingly. In an embodiment, a dithering technique to suppress spurious tones can be used with the low-pass filter based, ideal integrator based, or near ideal integrator based delta-sigma modulator. In another embodiment, a noise cancellation technique can also be used to cancel the dithering noise.

26 Claims, 9 Drawing Sheets

U.S. PATENT DOCUMENTS

| | | | |
|---|---|---|---|
| 6,184,812 B1 | 2/2001 | Younis et al. | |
| 6,271,782 B1 | 8/2001 | Steensgaard-Madsen | |
| 6,346,898 B1 | 2/2002 | Melanson | |
| 6,362,763 B1 | 3/2002 | Wang | |
| 6,396,428 B1 | 5/2002 | Cheng | |
| 6,445,318 B1 | 9/2002 | Ruha et al. | |
| 6,462,685 B1 | 10/2002 | Korkala | |
| 6,473,019 B1 | 10/2002 | Ruha et al. | |
| 6,657,500 B1 | 12/2003 | Chen | |
| 6,670,902 B1 | 12/2003 | Melanson et al. | |
| 6,693,572 B1 | 2/2004 | Oliaei et al. | |
| 6,765,517 B1 | 7/2004 | Ali | |
| 6,791,400 B2 | 9/2004 | Lou | |
| 6,838,929 B2 | 1/2005 | Mitteregger | |
| 6,880,262 B1 | 4/2005 | Jensen | |
| 6,930,624 B2 | 8/2005 | Hezar et al. | |
| 6,940,434 B2 * | 9/2005 | Brooks | 341/131 |
| 6,980,145 B1 | 12/2005 | Tammineedi | |
| 7,042,375 B1 | 5/2006 | van Engelen | |
| 7,095,345 B2 | 8/2006 | Nguyen et al. | |
| 7,098,730 B1 | 8/2006 | Shui | |
| 7,129,873 B2 | 10/2006 | Kawamura | |
| 2005/0030212 A1 | 2/2005 | Brooks | |
| 2005/0128111 A1 | 6/2005 | Brooks | |
| 2006/0139109 A1 | 6/2006 | Oustaloup et al. | |

FOREIGN PATENT DOCUMENTS

| | | |
|---|---|---|
| EP | 0964524 A2 | 12/1999 |
| EP | 1418674 A1 | 5/2004 |
| JP | 60263534 A | 6/1984 |
| JP | 2003258644 | 9/2003 |
| WO | WO 00/63786 A | 10/2000 |

OTHER PUBLICATIONS

Yan, Shouli, et al., "A Continuous-Time SD Modulator With 88-dB Dynamic Range and 1.1-MHz Signal Bandwidth," IEEE Journal on Solid-State Circuits, vol. 39, No. 1, Jan. 2001.

Silva, J. et al., "Wideband low-distortion delta-sigma ADC topology". Electronics Letters, 7$^{th}$ Jun. 2001, vol. 37, No. 12, pp. 737-738.

Wu, X., et al., "One-bit processing for digital control". IEE Proc.-Control Theory Appl., vol. 152, No. 4, Jul. 2005, pp. 403-410.

Xia, Bo et al., An RC Time Constant Auto-Tuning Structure for High Linearity Continuous-Time Modulators and Active Filters, IEEE Transactions on Circuits and Systems, pp. 2179-2188, I: Regular Papers, vol. 51, No. 11, Nov. 2004.

Paton, Susan et al., "A 70-mW 300 MHZ CMOS Continuous-Time SD ADC with 15 MHz Bandwidth and 11 Bits of Resolution," IEEE Journal of Solid State Circuits, vol. 39, No. 7, Jul. 2004.

Yan, Shouli, et al., "A Continuous-Time SD Modulator with 88-dB Dynamic Range and 1.1-MHz Signal Bandwidth," IEEE Journal, on Solid State Circuits, vol. 39, No. 1, Jan. 2001.

Norsworthy S R Ed, Institute of Electrical and Electronics Engineers: "Effective dithering of SIGMA-delta modulators" Proceedings of the International Symposium on Circuits and Systems. San Diego, May 10-13, 1992, Proceedings of the International Symposium on Circuits and Systems. (ISCAS), New York, IEEE, US, vol. vol. 4 Conf. 25, May 3, 1992, pp. 1304-1307, XP010061387 ISBN: 0-7803-0593-0.

Norsworthy S R et al: "Delta-SIGMA Data Converters" Delta-SIGMA Data Converters. Theory Design, and Simulation, New York, NY: IEEE, US, 1997, pp. 197-199, 309, 31, XP002322216 ISBN: 0-7803-1045-4, date unknown.

* cited by examiner

DITHERING NOISE CANCELLATION FOR A DELTA-SIGMA MODULATOR

This application is a continuation of U.S. patent application Ser. No. 11/255,792, titled Low-Pass Filter Based Delta-Sigma Modulator, filed on Oct. 21, 2005, the entirety of which is hereby incorporated herein by reference.

BACKGROUND OF THE INVENTION

1. Field of the Invention

The present invention relates to delta-sigma modulators in general, and in particular to delta-sigma modulators that are constructed from a basic building block of a first order low-pass filter.

2. Description of the Related Art

Delta-sigma modulators are widely used in over-sampling analog to digital converters (ADC) to achieve high-resolution analog-to-digital data conversion despite using coarse quantization. Delta-sigma modulators can be either discrete-time, which use discrete-time loop filters, or continuous-time, which use continuous-time loop filters.

In a typical discrete-time delta-sigma modulator, a sample and hold amplifier converts a continuous-time analog input signal into discrete-time analog samples. A discrete-time loop filter $H(z)$ filters the discrete-time analog sample and inputs the filtered discrete-time analog sample into a quantizer. The quantizer output is fed back via a digital-to-analog converter (DAC) and subtracted from the input sample by a summing circuit.

The discrete-time loop filter $H(z)$ is constructed using one or more discrete-time integrators, which are designed to mimic or approximate the ideal response of $k/(z-1)$, where $k$ is a gain constant. A switch-capacitor circuit is typically used to implement the discrete-time integrator. Functionally, a switch-capacitor integrator comprises a capacitor CS for sampling the input, a capacitor CI for integrating the input, and an operational trans-impedance amplifier (OTA), where the output voltage of the OTA is proportional to the charge stored on CI. The output discrete-time voltage is an integration of the input discrete-time voltage.

One problem with prior art discrete-time delta-sigma modulators is that there is inevitably some leakage for the charge stored on the integrating capacitor CI due to finite output resistance of the OTA. Instead of exhibiting an ideal response of $k/(z-1)$, a practical discrete-time integrator exhibits a response of $k/(z-\alpha)$, where $\alpha<1$ is a leakage factor depending on the value of CI and the output resistance of the OTA. To ensure the leakage is small, i.e. $\alpha$ is close to 1 (mathematically, $1-\alpha<<1$, a large integrating capacitor CI, an OTA with high output resistance, or a combination of both is used. In practice, large devices, which consume high power, are typically used. The problem becomes more pronounced for high-speed delta-sigma modulators based on low voltage, deep sub-micron CMOS processes. In such processes, it is typically difficult to design a high-speed OTA with high output resistance.

In a typical continuous-time delta-sigma modulator, a continuous-time loop filter $H(s)$ filters the continuous-time input signal and a quantizer converts the filtered analog signal into a discrete time output sample in accordance with a clock signal. The quantizer output is fed back via a digital-to-analog converter (DAC) and subtracted from the input signal by a summing circuit.

The continuous-time loop filter $H(s)$ is typically constructed using one or more continuous-time integrators, which are designed to mimic the ideal response of $k/s$, where $k$ is a gain constant. For high-speed applications, a transimpedance amplifier-capacitor (OTA-C) circuit comprising an operational trans-impedance amplifier (OTA) and a capacitor C is typically used to implement the continuous-time integrator. In the typical operation of an OTA-C integrator with a transconductance of Gm, the OTA converts the input voltage into a current, which is integrated by the capacitor C at the output. The OTA output voltage is proportional to the time-integral of the input voltage.

In practice, the finite output resistance of the OTA results in a leakage and causes the integrator to exhibit a response of $k/(s+p)$, where $p$ is a pole determined by the output resistance of the OTA and the capacitor C. To ensure the leakage is small, i.e. $p$ is very small compared to the clock frequency (mathematically, $p<<2\pi/T$ where T is the clock period), a large integrating capacitor, an OTA with high output resistance, or a combination of both is used. In practice, large devices, which typically consume high power, are used. The problem becomes more pronounced for high-speed delta-sigma modulators based on low voltage, deep sub-micron CMOS processes, because in such processes it is typically difficult to design high-speed OTA with a high output resistance.

SUMMARY OF THE INVENTION

It is desirable to have a delta-sigma modulator, using either discrete-time or continuous-time loop filters, that does not require a low leakage integrator.

In an embodiment, a delta-sigma modulator is constructed from one or more stages of a first order low-pass filter, which has a modest gain compared to the integrator used in prior art delta-sigma modulators. Prior art integrator based delta-sigma modulators can be converted into low-pass filter based delta-sigma modulators, according to an embodiment of the invention, by replacing the ideal integrator building block with a first order low-pass filter and adjusting other loop parameters, such as gain factors, accordingly.

In an embodiment, the delta-sigma modulator comprises dithering circuitry to suppress spurious tones. In another embodiment, the delta-sigma modulator comprises a noise cancellation circuit to cancel the dithering noise.

In an embodiment, a low-pass filter based delta-sigma modulator is disclosed. The delta-sigma modulator comprises a loop filter to receive an input signal and a feedback signal, where the loop filter comprises at least one $1^{st}$ order low-pass filter element that has a modest DC gain, a quantizer to digitize the output of the loop filter into digital data, and a digital-to-analog converter (DAC) to convert the digital data of the quantizer into the feedback signal.

In an embodiment, a method of performing delta-sigma data conversion is disclosed. The method comprises receiving an input signal and a feedback signal, filtering a combination of the input signal and the feedback signal using a loop filter comprising at least one $1^{st}$ order low-pass filter element that has a modest DC gain, quantizing the output of the loop filter to generate a digital output, and generating the feedback signal by converting the digital output into an analog signal.

In a further embodiment, a delta-sigma modulator comprises means for receiving an input signal and a feedback signal, means for filtering a combination of the input signal and the feedback signal using a loop filter comprising at least one 1st order low-pass filter element that has a modest DC gain, means for quantizing the output of the loop filter to generate a digital output, and means for generating the feedback signal by converting the digital output into an analog signal.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements. In addition, the first digit of each reference number indicates the figure in which the element first appears.

DETAILED DESCRIPTION OF THE PREFERRED EMBODIMENT

The present invention relates to a method and apparatus for constructing a delta-sigma modulator using one or more stages of first order low-pass filters. While the specifications describe several example embodiments of the invention considered best modes of practicing the invention, it should be understood that the invention can be implemented in many ways and is not limited to the particular examples described below or to the particular manner in which any features of such examples are implemented.

Figure 1:
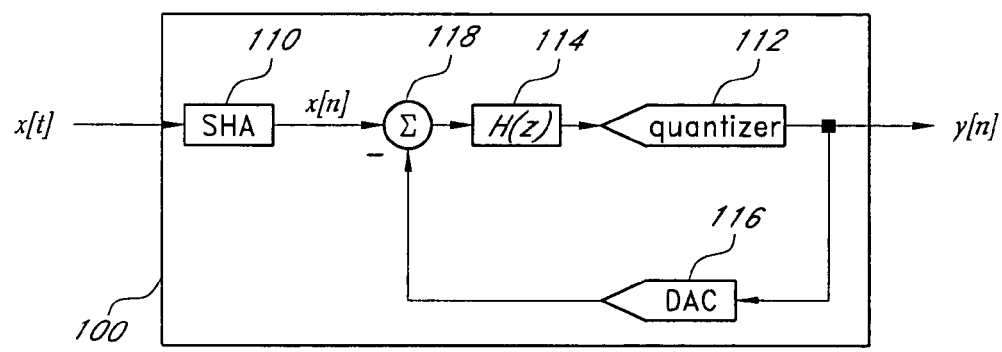
FIG. 1 is a schematic diagram of an embodiment of a discrete-time delta sigma modulator.

FIG. 1 is a schematic diagram of an embodiment of a discrete-time delta sigma modulator 100 comprising a sample and hold amplifier (SHA) 110, a quantizer 112, a discrete-time filter 114, a digital-to-analog converter (DAC) 116, and a summing circuit 118. The sample and hold amplifier 110 is used to convert a continuous-time analog input signal x(t) into a discrete-time analog sample x[n], which is input to the quantizer 112 via the discrete-time filter H(z) 114. The quantizer output y[n] is fed back via the digital-to-analog converter 116 and subtracted from the input sample x[n] by the summer 118.

Figure 2:
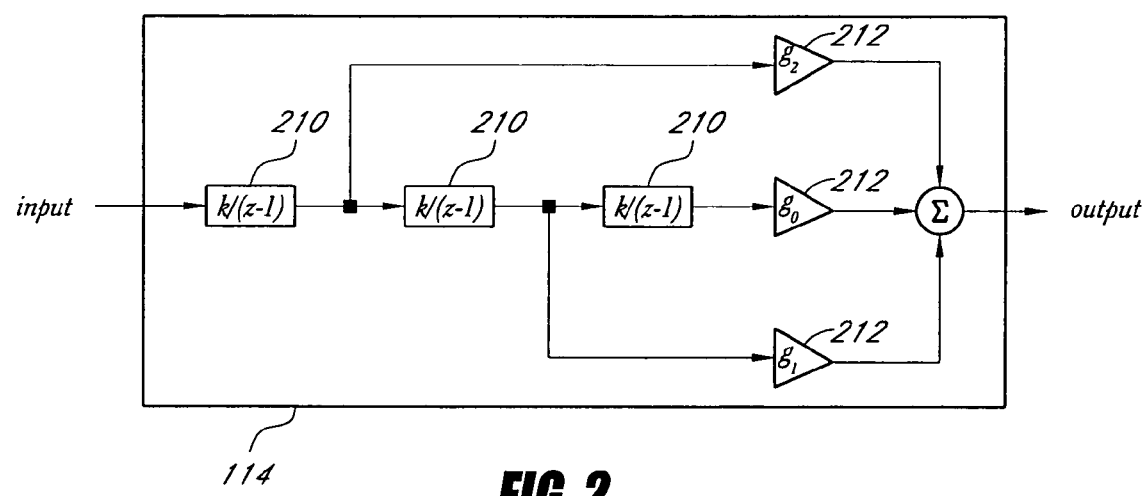
FIG. 2 is a schematic diagram of an embodiment of a third order discrete-time loop filter comprising three discrete-time integrators.

In an embodiment, the discrete-time loop filter H(z) 114 is constructed using one or more discrete-time integrators, which are designed to mimic or approximate the ideal response of $k/(z-1)$, where k is a gain constant. FIG. 2 is a schematic diagram of an embodiment of a third order discrete-time loop filter H(z) 114 that can be used in the discrete-time delta sigma modulator 100. In an embodiment, the filter H(z) 114 comprises three discrete-time integrators 210 and three gain elements 212, where each gain element 212 has a gain of $g_0$, $g_1$, and $g_2$, respectively. In an embodiment, $g_0$, $g_1$, and $g_2$ have the same value. In another embodiment, $g_0$, $g_1$, and $g_2$ have different values. In an embodiment, the discrete-time integrator 210 comprises a switch-capacitor circuit.

Figure 3:
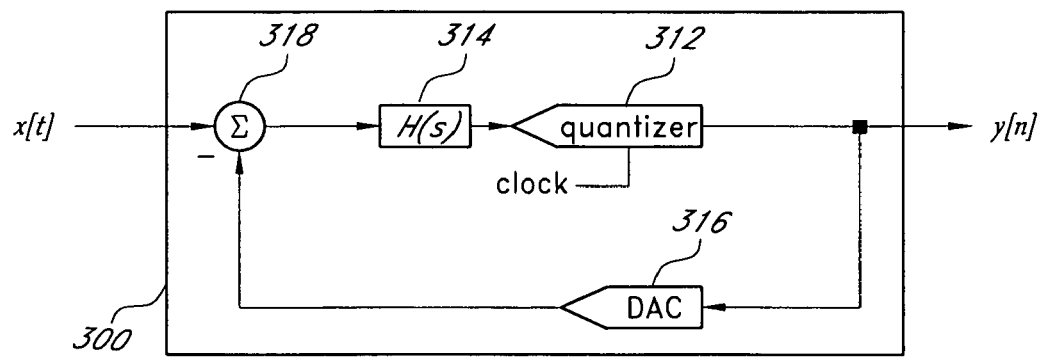
FIG. 3 is a schematic diagram of an embodiment of a continuous-time delta sigma modulator.

FIG. 3 is a schematic diagram of an embodiment of a continuous-time delta sigma modulator 300 comprising a quantizer 312, a continuous-time filter H(s) 314, a digital-to-analog converter 316, and a summing circuit 318. The continuous-time analog input signal x(t) is input to the quantizer 312 via the continuous-time filter H(s) 314, and converted into a discrete-time output y[n]. The discrete-time quantizer output y[n] is fed back via the digital-to-analog converter 316 and subtracted from the input signal x(t) by the summer 318.

Figure 4:
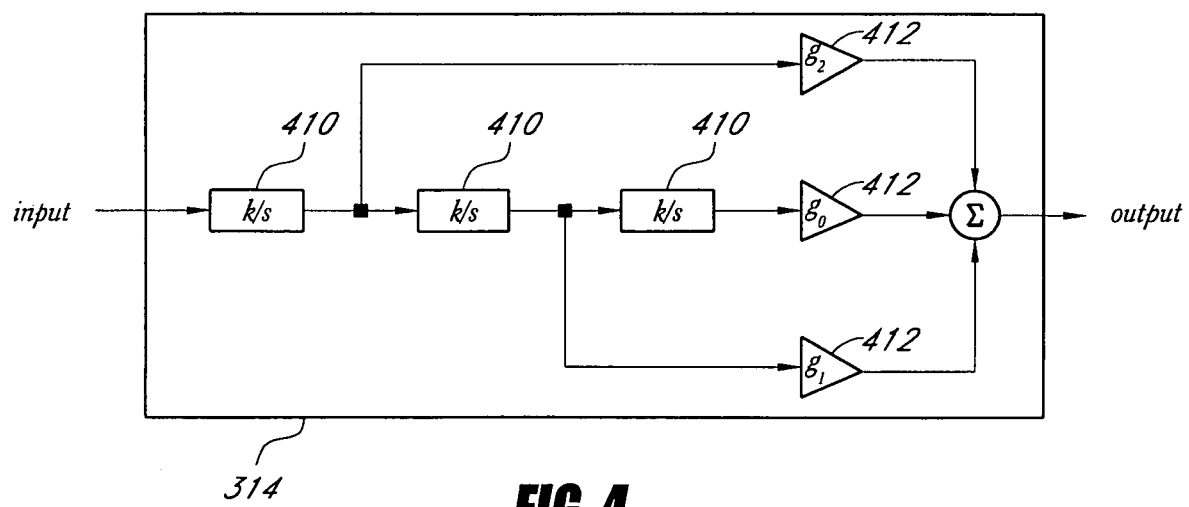
FIG. 4 is a schematic diagram of an embodiment of a third order continuous-time loop filter comprising three continuous-time integrators.

In an embodiment, the continuous-time loop filter H(s) 314 is constructed using one or more continuous-time integrators, which are designed to mimic or approximate the ideal response of $k/s$, where k is a gain constant. FIG. 4 is a schematic diagram of an embodiment of a third order continuous-time loop filter H(s) 314 that can be used in the continuous-time delta sigma modulator 300. In an embodiment, the filter H(s) 314 comprises three continuous-time integrators 410 and three gain elements 412, where each gain element 412 has a gain of $g_0$, $g_1$, and $g_2$, respectively. In an embodiment, $g_0$, $g_1$, and $g_2$ have the same value. In another embodiment, $g_0$, $g_1$, and $g_2$ have different values. In an embodiment, the continuous-time integrator 410 is a trans-impedance amplifier-capacitor (OTA-C) circuit.

Figure 5:
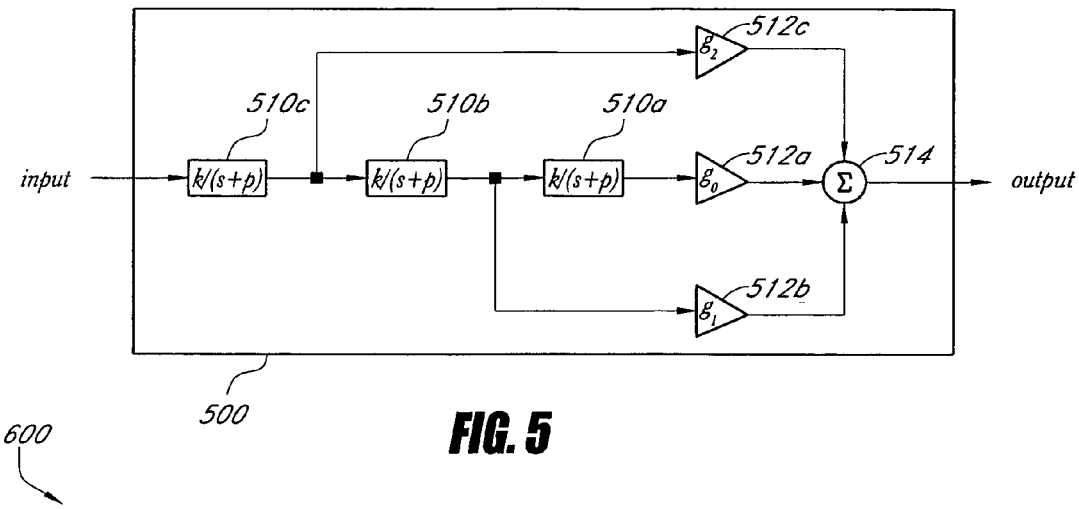
FIG. 5 is a schematic diagram of an embodiment of a third order continuous-time loop filter comprising three first order low-pass filters.

FIG. 5 is a schematic diagram of an embodiment of a continuous-time loop filter H(s) 500 comprising first order low-pass filters 510, gain elements 512, and a summing circuit 514 that can be used in the continuous-time delta-sigma modulator 300. Instead of using continuous-time integrators 410 designed to mimic or approximate the ideal response of k/s, as in FIG. 4, the continuous-time loop filter H(s) 500 comprises first order low-pass filters 510 having the response of k/(s+p), where p is a pole. In an embodiment, the pole p is not much smaller than the clock angular frequency $2\pi/T$.

In an embodiment, the first order low-pass filter element has a modest DC gain. In an embodiment, the range of the modest DC gain is approximately half of the modulator over-sampling rate to approximately the modulator over-sampling rate. In another embodiment, the modest DC gain is greater than the over-sampling rate of the modulator. In a further embodiment, the modest DC gain is less than half of over-sampling rate of the modulator.

In an embodiment, the cut-off frequency of the first order low-pass filter element is approximately half of the signal bandwidth of the modulator to approximately the signal bandwidth of the modulator. In another embodiment, the cut-off frequency of the first order low-pass filter is less than half of the signal bandwidth of the modulator. In a further embodiment, the cut-off frequency of the first order low-pass filter is greater than the signal bandwidth of the modulator.

In an embodiment, the filter H(s) 500 comprises three first order-low-pass filters 510a, 510b, 510c, three gain elements 512a, 512b, 512c, and a summing circuit 514. In an embodiment, each gain element 512a, 512b, and 512c, has a gain of $g_0$, $g_1$, and $g_2$, respectively. The first order low-pass filter 510c receives the filter input. The first order low-pass filter 510b and the gain element 512c receive the output of the low-pass filter 510c. The first order low-pass filter 510a and the gain element 512b receive the output of the low-pass filter 510b. The gain element 512a receives the output of the filter 510a. The summing circuit 514 sums the outputs of the gain elements 512a, 512b, 512c, and produces the filter output. The filter H(s) thus exhibits the following transfer function: $H(s) = g_0 \cdot k^3/(s+p)^3 + g_1 \cdot k^2/(s+p)^2 + g_2 \cdot k/(s+p)$. Those with ordinary skill in the art will readily recognize that numerous alternative arrangements on using low pass filters 510, gain elements 512, and one or more summing circuits 514 will result in the same transfer function. In one embodiment, each of the three gain elements 512a, 512b, 512c is an amplifier that provides a respective gain. In another embodiment, the three gain elements 512a, 512b, and 512c are absorbed as part of the summing circuit 514 by adjusting certain circuit elements, e.g. resistor values connected to the input of an operational-amplifier with resistor feedback, and therefore no explicit amplification circuits are needed.

In another embodiment, the continuous-time loop filter 500 comprises more than three first order low-pass filters 510. In yet another embodiment, the continuous-time loop filter 500 comprises less than three first order low-pass filters 510.

In the following example, the continuous-time delta-sigma modulator 300 comprises the continuous-time loop filter 500 which uses the first order low-pass filters 510. To operate the delta-sigma modulator 300 at an over-sampling ratio of 16, the filter parameters for the continuous-time loop filter 500 are approximately:

k=1/T, where k is the gain constant of the filters 510, and T is the clock period.
p=0.1054/T, where p is the pole of the filters 510.
$g_2$=1.2, where $g_2$ is the gain of the gain element 512c.
$g_1$=0.9, where $g_1$ is the gain of the gain element 512b.
$g_0$=0.5, where $g_0$ is the gain of the gain element 512a.

For the purpose of comparison, to achieve a similar signal-to-quantization-noise ratio for the continuous-time delta-sigma modulator 300 comprising the continuous-time loop filter 400 using ideal integrators 410, the loop filter parameters are approximately:

k=1/T, where k is the gain constant of the integrators 410 and T is the clock period.
$g_2$=1.58, where $g_2$ is the gain of the gain element 412c.
$g_1$=1.36, where $g_1$ is the gain of the gain element 412b.
$g_0$=1.07, where $g_0$ is the gain of the gain element 412a.

Figure 6:
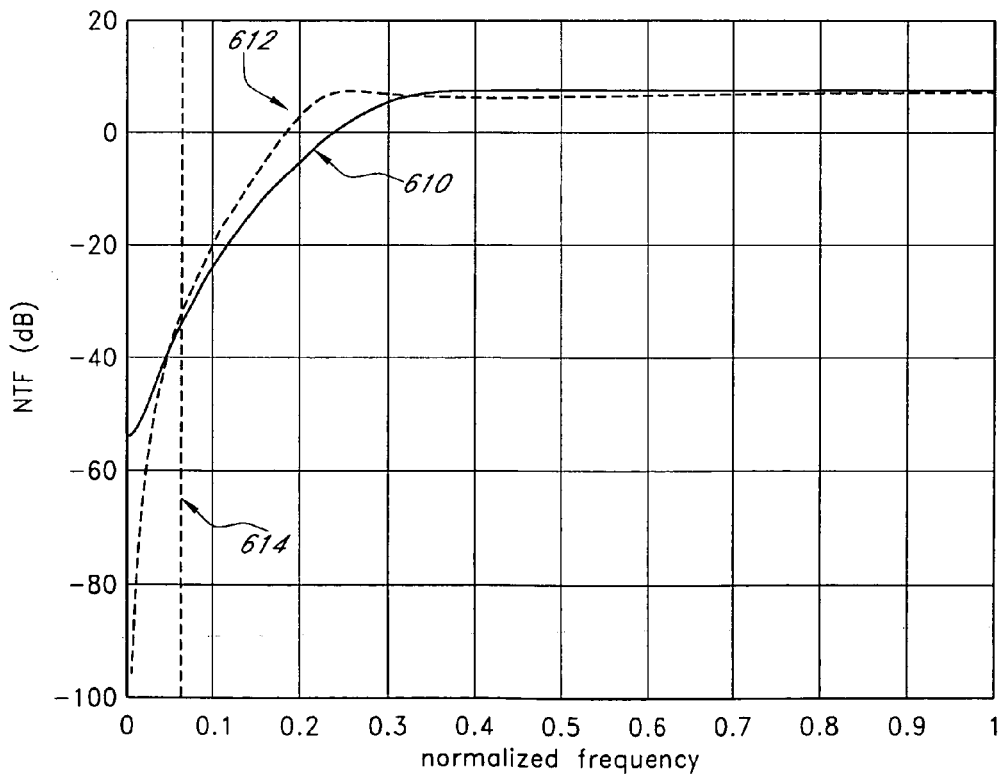
FIG. 6 is a graph of the noise transfer function of an embodiment of the low-pass filter based delta-sigma modulator and the noise transfer function of an embodiment of the ideal integrator based delta-sigma modulator.

FIG. 6 is a graph 600 of the noise transfer function (NTF) of the delta-sigma modulator described in the above example. The noise transfer function (NTF) describes the spectral shaping of the quantization noise. The vertical axis of the graph 600 represents the noise transfer function in decibels (dB) and the horizontal axis of the graph 600 represents the normalized frequency.

The noise transfer function of the delta-sigma modulator 300 using the loop filter 500 is shown as a solid line 610. For the purpose of comparison, the noise transfer function of the delta-sigma modulator 300 using the loop filter 400 is shown as a dashed line 612. The signal band edge is represented by a vertical line 614.

Both delta-sigma modulators 300 operate at approximately the same over-sampling ratio of 16 and achieve about 54-dB in-band integrated noise suppression. However, the loop filter 500 comprising the first order low-pass filters 510, in an embodiment, offers better stability, better tolerance to loop component value variation, and better tolerance to clock jitter than the loop filter 400 comprising the ideal or close to ideal integrators 410.

The poles of the noise transfer function 610 are placed further inside the unit circuit in the complex z-plane than the poles of the noise transfer function 612, which is the border of stability.

The noise transfer function 610 changes more gradually near the band edge 614 than the noise transfer function 612, thus making the response of the delta-sigma modulator 300 comprising the first order low-pass filter 500 less sensitive to component value variation.

Clock jitter causes out-of-band quantization noise to spread into the signal band. The noise transfer function 610 changes more gradually near the band edge 614 than the noise transfer function 612, thus making the jitter-induced quantization noise spreading less severe for the delta-sigma modulator 300 comprising the filter 500.

In an embodiment, the basic building block of the first order low-pass filter 510 is easier to design than the ideal or near ideal integrator 410, thus allowing a smaller circuit area and lower power consumption.

Figures 7A, 7B:
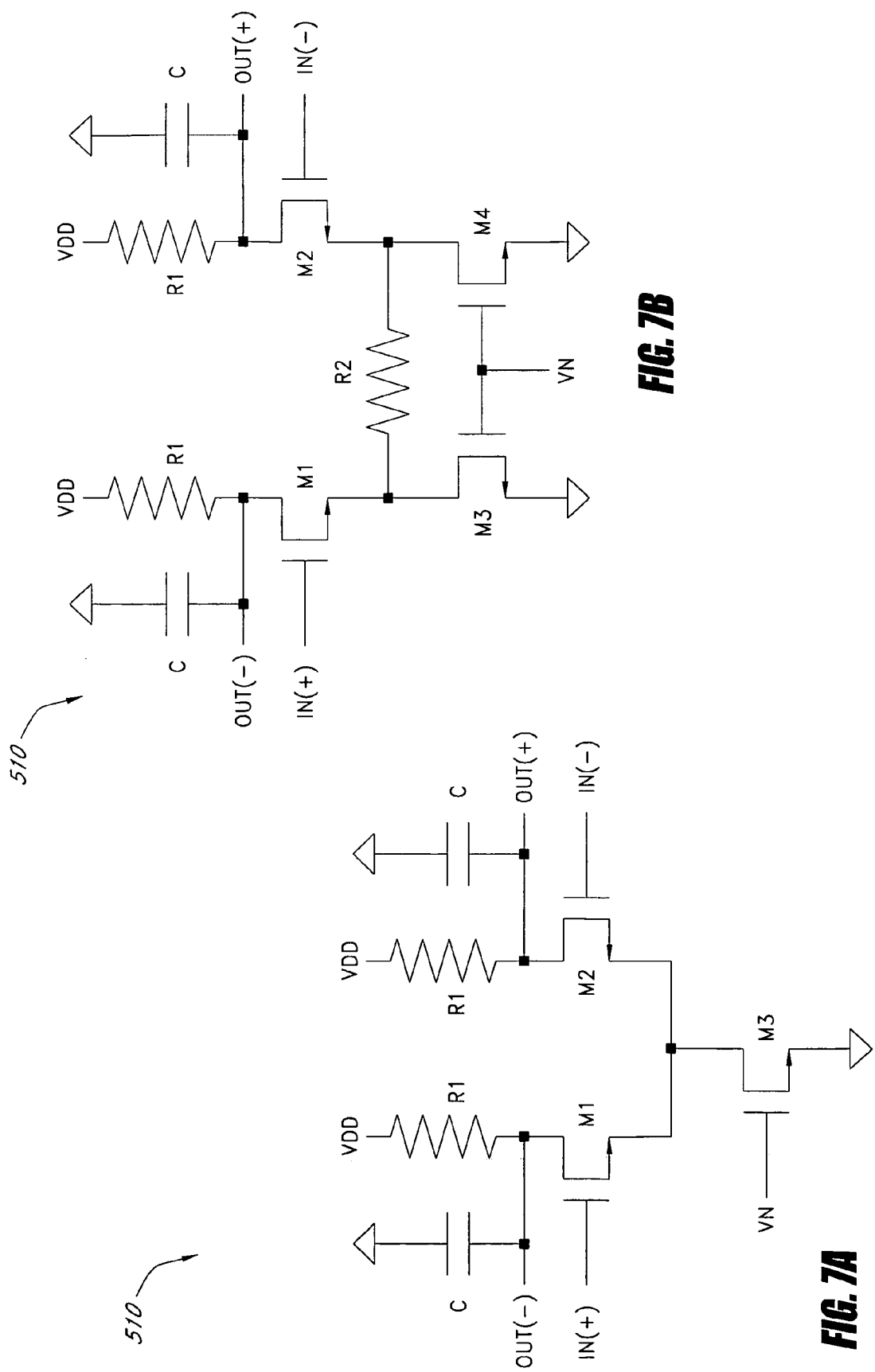
FIG. 7A is a schematic diagram of an embodiment of a first order low-pass filter that exhibits the response $k/(s+p)$.
FIG. 7B is a schematic diagram of another embodiment of a first order low-pass filter that exhibits the response $k/(s+p)$.

FIGS. 7A-7D illustrate exemplary implementations of the building block of the first order low-pass filter 510 that exhibit the response of k/(s+p). FIG. 7A is a schematic diagram of a differential pair amplifier comprising transistors M1-M2 and a biasing transistor M3, with a load comprising a pair of resistors R1 and a pair of capacitors C. Each differential input transistor M1, M2 of the differential pair amplifier has a load comprising the resistor R1 in parallel with the capacitor C.

FIG. 7B is a schematic diagram of a differential pair amplifier comprising transistors M1-M2, a pair of biasing transistors M3 and M4, with a load comprising a pair of resistors R1 and a pair of capacitors C, and a degeneration resistor R2. Each differential input transistor M1, M2 of the differential pair amplifier has a load comprising the resistor R1 in parallel with the capacitor C. The low-pass filter 510 of FIG. 7B is similar to the low-pass filter 510 of FIG. 7A with the additional source degeneration resistor R2 that improves the linearity.

Figure 7D:
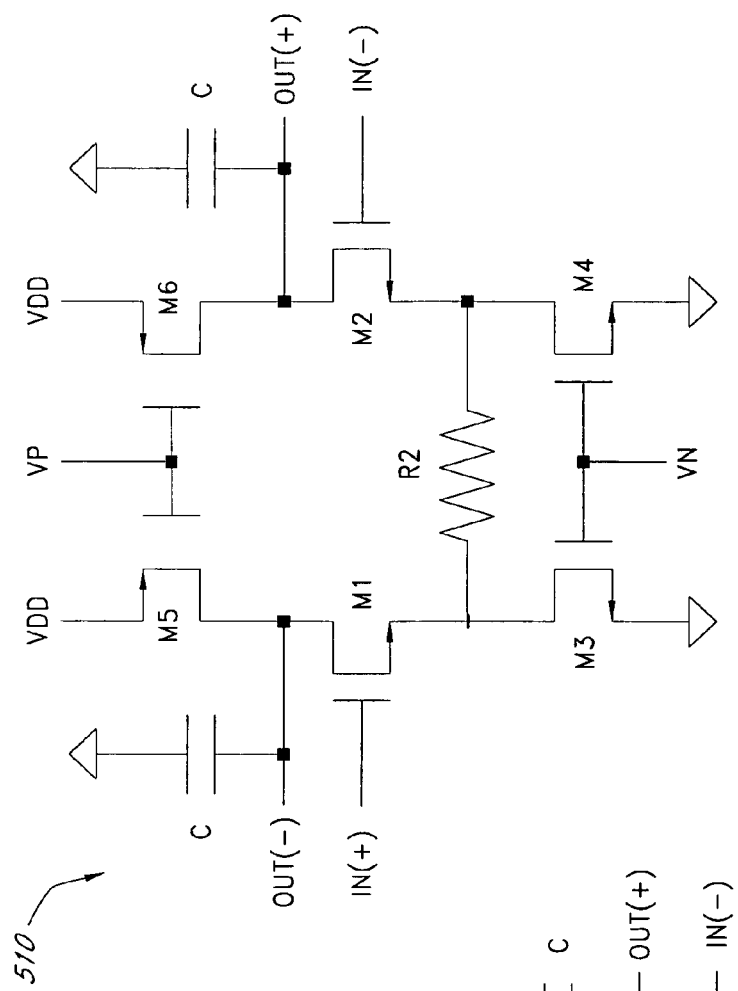
FIG. 7D is a schematic diagram of another embodiment of a first order low-pass filter that exhibits the response $k/(s+p)$.
Figure 7C:
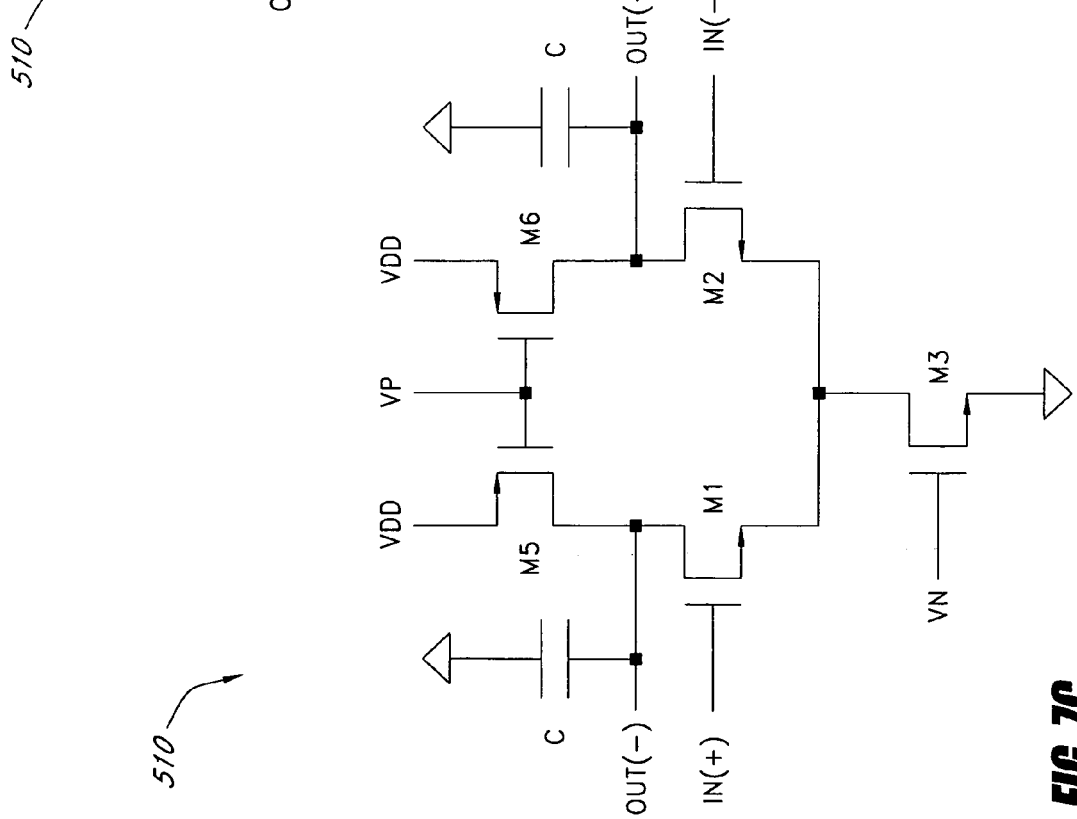
FIG. 7C is a schematic diagram of another embodiment of a first order low-pass filter that exhibits the response $k/(s+p)$.

FIG. 7C is a schematic diagram of a differential pair amplifier comprising transistors M1-M2, a biasing transistor M3, with a load comprising a pair of PMOS transistors M5, M6, and a pair of capacitors C. Each differential input transistor M1, M2 of the differential pair amplifier has a load comprising the PMOS transistor M5, M6, respectively, in parallel with the capacitor C.

FIG. 7D is a schematic diagram of a differential pair amplifier comprising transistors M1-M2, a pair of biasing transistors M3 and M4, with a load comprising a set of PMOS transistors M5, M6, and a pair of capacitors C, and a degeneration resistor R2. Each differential input transistor M1, M2 of the differential pair amplifier has a load comprising the PMOS transistor M5, M6, respectively, in parallel with the capacitor C. The low-pass filter 510 of FIG. 7D is similar to the low-pass filter 510 of FIG. 7C with the additional source degeneration resistor R2 that improves the linearity.

In FIGS. 7A-7D, VN is a bias voltage that controls the bias current for the differential pair and VDD is a supply voltage. In FIGS. 7C and 7D, VP is a bias voltage that controls the effective resistance of the PMOS load.

In an embodiment, these full differential circuits can comprise common-mode feedback circuitry to establish a desired common-mode output voltage. A common-mode feedback circuit for fully differential amplifiers is well known in prior art, and thus, is not shown here.

Figure 8:
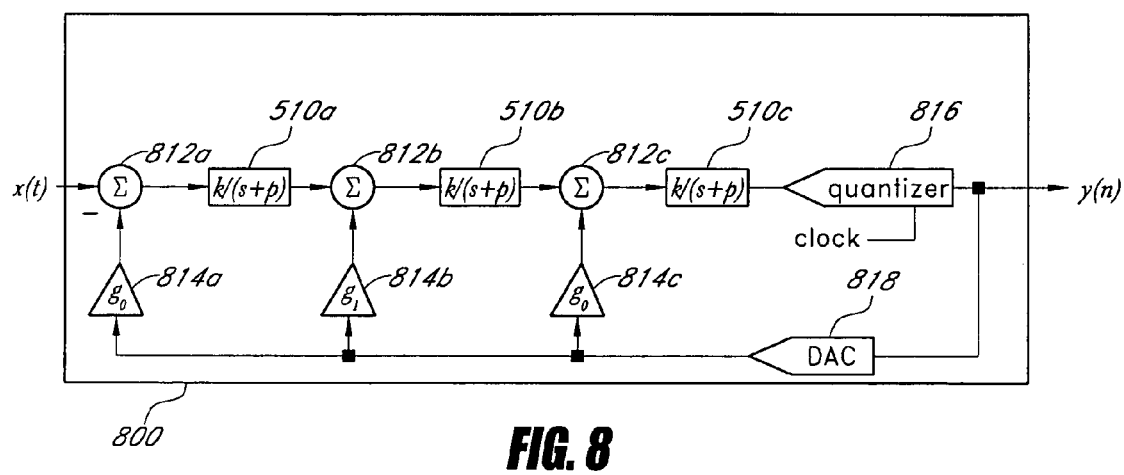
FIG. 8 is a schematic diagram of an embodiment of a third order continuous-time delta-sigma modulator.

FIG. 8 is a schematic diagram of an embodiment of a third order continuous-time delta-sigma modulator 800 comprising first order low-pass filters 510, summing circuits 812, gain elements 814, a quantizer 816, and a digital-to-analog converter 818. The basic building block is the first order low-pass filter 510 that exhibits the response of k/(s+p), however, the signal routing and summation among the low-pass filter building blocks 510 are different from that of the signal routing and summation in the continuous-time loop filter 500.

The continuous-time input signal x(t) is input into the quantizer 816 via low-pass filters 510a, 510b, 510c connected in series and converted to the discrete-time output y[n] in accordance with a clock signal. The discrete-time quantizer output y[n] is fed back via the digital-to-analog converter 818 to the input of each of the gain elements 814a, 814b, 814c. The output of the gain element 814a is subtracted from the continuous-time input signal x(t) by the summer 812a. The output of the gain element 814b is subtracted from the output of the low-pass filter 510a by the summer 812b. The output of the gain element 814c is subtracted from the output of the low-pass filter 510b by the summer 812c. In one embodiment, each of the three gain elements is implemented by an explicit amplifier circuit. In another embodiment, each gain element is implemented by scaling the output of the DAC 818 using a respective ratio control by a ratio of circuit element values, e.g. resistors or capacitors used by the DAC 818, and therefore an explicit amplifier circuit is not needed.

There can be numerous alternative routing and summation that allows the delta-sigma modulator 300 to exhibit the same noise transfer function. In an embodiment, the low-pass filter 510 having the response k/(s+p) can be applied to any architecture and topology used in continuous-time delta-sigma modulators by simply replacing the ideal integrator 410 having the response k/s with the first order low-pass filter 510 and appropriately selecting the gain factors and other parameters. In another embodiment, each first order low-pass filter 510 may have different values of k and p.

Figure 9:
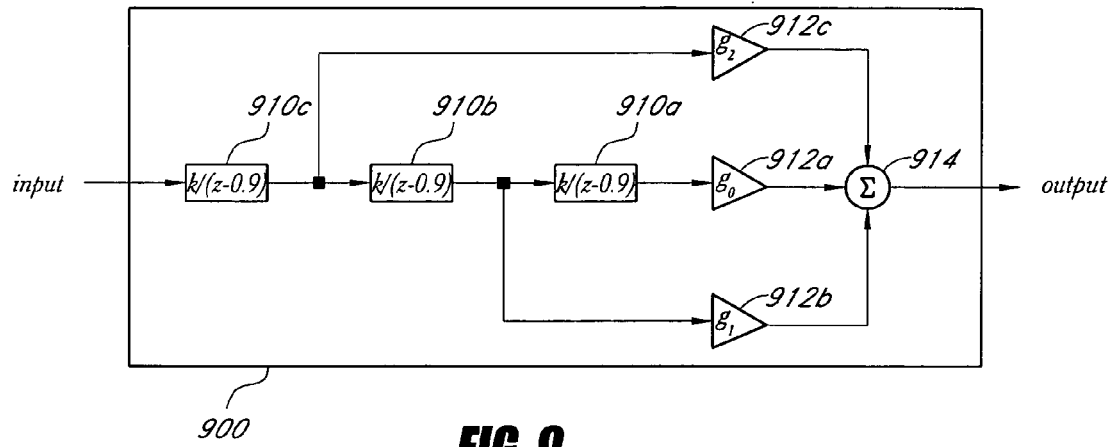
FIG. 9 is a schematic diagram of an embodiment of a third order discrete-time loop filter for a discrete-time delta-sigma modulator.

An embodiment of the invention can also be applied to discrete-time delta-sigma modulators. FIG. 9 is a schematic diagram of an embodiment of a third order discrete-time loop filter 900 that can be used in the discrete-time delta-sigma modulator 100. The discrete-time loop filter 900 comprises first order low-pass filters 910, gain elements 912, and a summing circuit 914. The low-pass filter 910 having the response k/(z−β), where β=0.9 in the embodiment of FIG. 9, is used in lieu of the ideal (or near ideal) integrator 210 having the response k/(z−1) of FIG. 2. In an embodiment, the three gain elements 912 are absorbed as part of the summing circuit 914 by adjusting respective capacitor values of a switched capacitor circuit that implements the summing circuit 914.

In an embodiment, the discrete-time loop filter H(z) 900 comprises three first order-low-pass filters 910a, 910b, 910c, three gain elements 912a, 912b, 912c, and a summing circuit 914. In an embodiment, each gain elements 912a, 912b, and 912c, has a gain of $g_0$, $g_1$, and $g_2$, respectively. The first order low-pass filter 910c receives the filter input. The first order low-pass filter 910b and the gain element 912c receive the output of the low-pass filter 910c. The first order low-pass filter 910a and the gain element 912b receive the output of the low-pass filter 910b. The gain element 912a receives the output of the low-pass filter 910a. The summing circuit 914 sums the outputs of the gain elements 912a, 912b, 912c, and produces the filter output.

In an embodiment, the discrete-time loop filter 900 comprises more than three first order low-pass filters 910. In another embodiment, the discrete-time loop filter 900 comprises less than three first order low-pass filters 910. In an embodiment, the "β" factor of the first order low-pass filter element is approximately 0.5/OSR to 1/OSR, where OSR is the over-sampling ratio of the modulator. In another embodiment, the "β" factor of the first order low-pass filter element is less than 0.5/OSR. In a further embodiment, the "β" factor of the first order low-pass filter element is greater than 1/OSR.

As discussed above, the first order low-pass filter embodiment offers a better stability, better tolerance of component value variation, and easier circuit design than the delta-sigma modulator 100 comprising the integrator 210.

An embodiment of the invention can be applied to any architecture and topology used in discrete-time delta-sigma modulators by simply replacing the ideal integrator 210 having the response k/(z−1) with the first order low-pass filter 910 having the response k/(z−β) and appropriately selecting the gain factors and other parameters. In another embodiment, each first order low-pass filter 910 can have different values of k and β.

Delta-sigma modulators can be prone to yielding "limit-cycle tones" that result in spurious tones in the output spectrum. A dithering technique can be applied in an embodiment to suppress the limit cycle tones by injecting pseudo-random noise into the modulator loop to de-correlate the quantization noise and break up a potentially temporary periodic pattern in the quantization noise.

Figure 10:
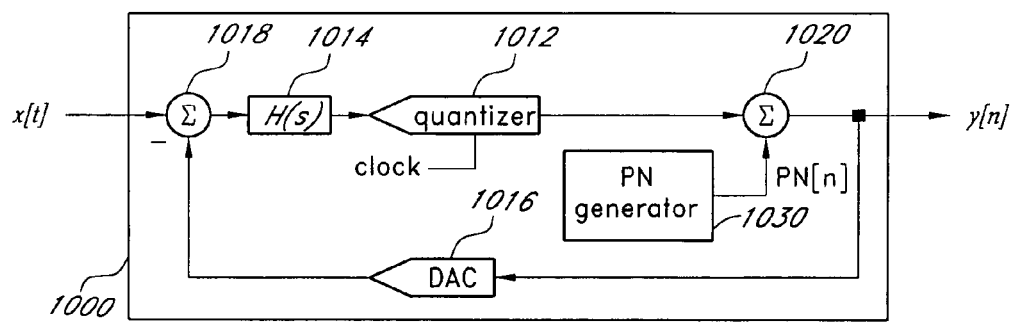
FIG. 10 is a schematic diagram of an embodiment of a continuous-time delta-sigma modulator with a dithering circuit.

FIG. 10 is a schematic of an embodiment of a continuous-time delta-sigma modulator 1000 with a dithering circuit comprising a pseudo-random number generator 1030 and a summing circuit 1020. The continuous-time delta-sigma modulator 1000 further comprises a quantizer 1012, a continuous-time filter H(s) 1014, a digital-to-analog converter 1016, and a summing circuit 1018.

The dithering signal, which comprises a pseudo-random noise sequence PN[n] generated by the pseudo-random number generator 1030, is added to the quantizer output via the summer 1020, and thus injected to the modulator loop between the quantizer output and the modulator output. In an embodiment, the modulator loop spectrally shapes the injected pseudo-random number sequence PN[n]. In an embodiment, the dithering circuit implementation is digital. In another embodiment (not shown in the figure), the dithering circuit is implemented as analog circuitry by moving the PN generator 1030 and the summing circuit 1020 to precede the quantizer 1012. In yet another embodiment (not shown in the figure), the dithering circuitry is implemented as a combination of digital and analog circuitry.

Figure 11:
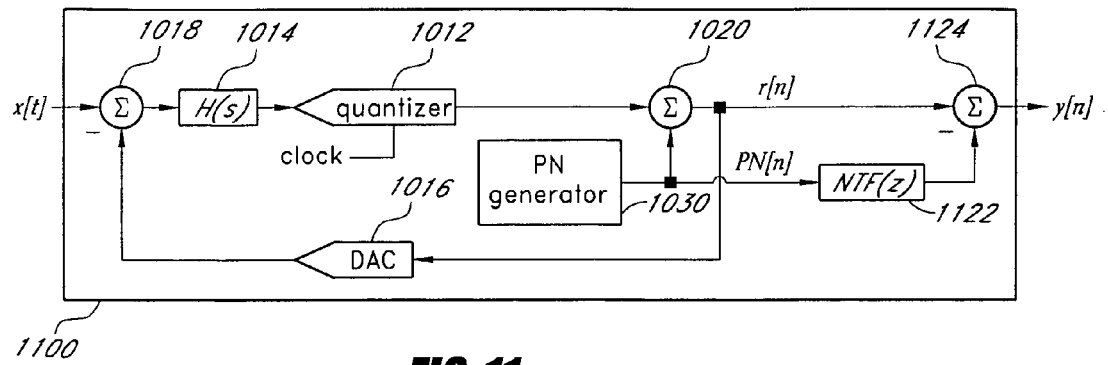
FIG. 11 is a schematic diagram of an embodiment of a continuous-time delta-sigma modulator with a dithering circuit and a noise cancellation circuit.

In another embodiment, the system performance can be improved by subtracting the noise caused by dithering. FIG. 11 is a schematic diagram of an embodiment of a continuous-time delta-sigma modulator 1100 with the dithering circuit, comprising the pseudo-random number generator 1030 and the summing circuit 1020, and a noise cancellation circuit comprising a filter block NTF(z) 1122 and a summing circuit 1124. The continuous-time delta-sigma modulator 1100 further comprises the quantizer 1012, the continuous-time filter H(s) 1014, the digital-to-analog converter 1016, and the summing circuit 1018.

In an embodiment, the added noise due to dithering, which is the output of the filter block NTF(z) 1122, is subtracted from the output r[n] by the summer 1124. In an embodiment, the filter block NTF(z) 1122 is the noise transfer function of the modulator 1100 that approximates the response of the modulator seen by the pseudo-random number sequence PN[n] when the pseudo-random number sequence PN[n] is added to the modulator loop. The noise transfer function NTF(z) depends on the implementation of the loop filter. For example, $NTF(z)=(1-z^{-1})^2$ is the noise transfer function for a second order continuous-time delta-sigma modulator.

For those with ordinary skill in the art, the same dithering and noise cancellation technique can be applied to any delta-sigma modulator, either continuous-time or discrete-time, regardless of whether the modulator is based on the ideal integrators, the near ideal integrators, the low-pass filter 910, or the low-pass filters 510 according to embodiments of the invention.

Figure 12:
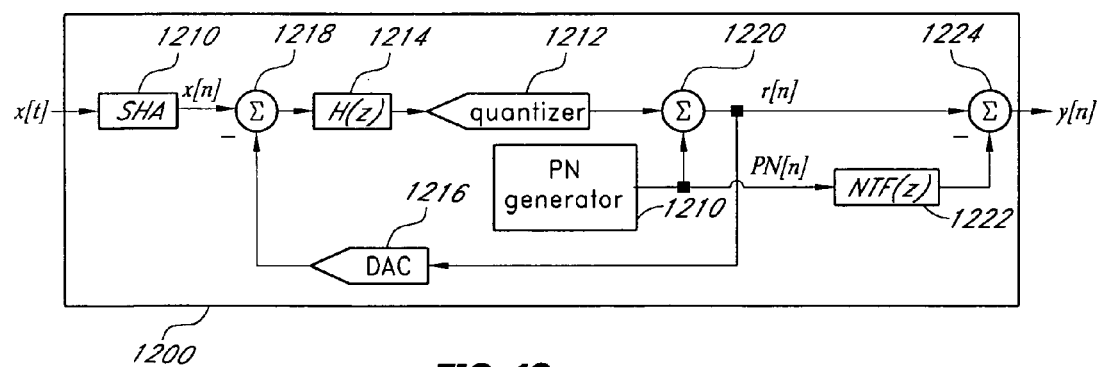
FIG. 12 is a schematic diagram of an embodiment of a discrete-time delta-sigma modulator with a dithering circuit and a noise cancellation circuit.

For example, the dithering and noise cancellation technique according to an embodiment of the invention can be applied to a general discrete-time delta-sigma modulator. FIG. 12 is a schematic diagram of an embodiment of a discrete-time delta-sigma modulator 1200 with a dithering circuit, comprising a pseudo-random noise generator 1210 and a summing circuit 1220, and a noise cancellation circuit, comprising a filter block NTF(z) 1222 and a summing circuit 1224. The discrete-time delta modulator 1200 further comprises a sample and hold amplifier (SHA) 1210, a quantizer 1212, a discrete-time filter 1214, a digital-to-analog converter (DAC) 1216, and a summing circuit 1218.

In an embodiment, the dithering signal, which comprises a pseudo-random noise sequence PN[n] generated by the pseudo-random number generator 1210, is added to the quantizer output by the summer 1220, and thus injected into the modulator loop between the quantizer output and the modulator output.

The optional noise cancellation can be performed by including the filter block NTF(z) 1222 and the summer 1224. In an embodiment, the added noise due to dithering, which is the output of the filter block NTF(z) 1222, is subtracted from the output r[n] by the summer 1224. In an embodiment, the filter block NTF(z) 1222 is the noise transfer function of the modulator 1200 that approximates the response of the modulator seen by the pseudo-random number sequence when the pseudo-random number sequence is added to the modulator loop. As in the continuous-time case, the noise transfer function NTF(z) depends on the implementation of the loop filter. For example, the noise transfer function is $NTF(z)=(1-z^{-1})^2$ for a second order discrete-time delta-sigma modulator using a loop filter having a filter response of $H(z)=(2z^{-1}-z^{-2})/(1-z^{-1})^2$.

Figure 13:
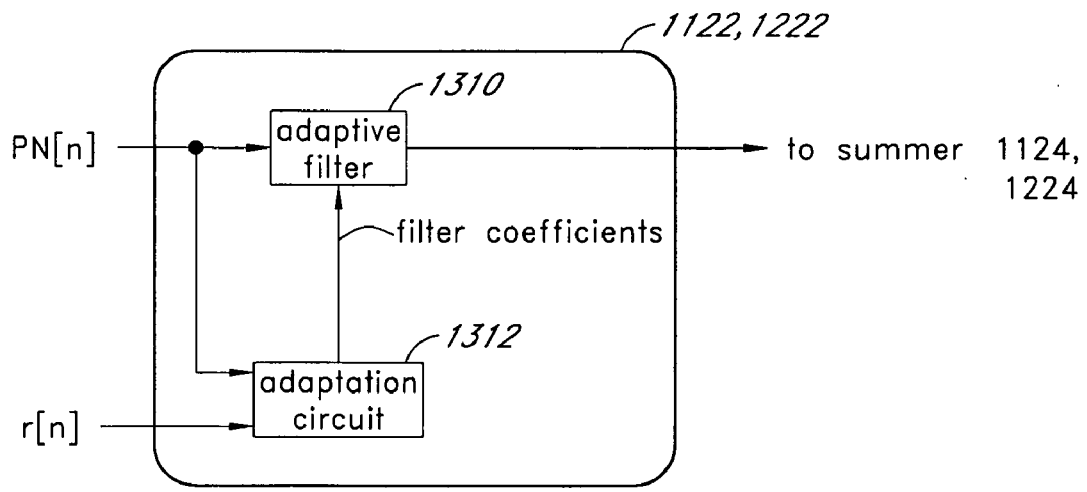
FIG. 13 is a schematic diagram of an embodiment of the noise transfer function of the noise cancellation circuit.
Figure 14:
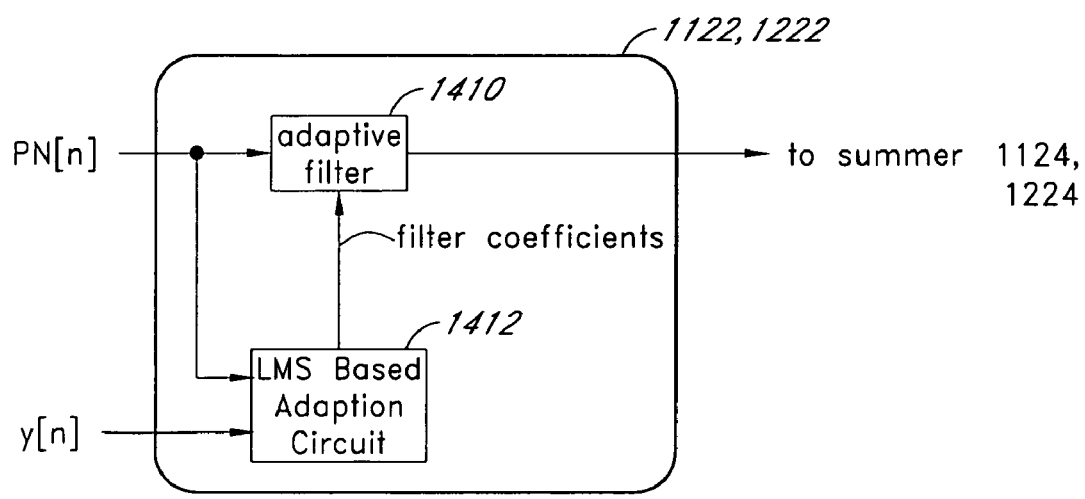
FIG. 14 is a schematic diagram of another embodiment of the noise transfer function of the noise cancellation circuit.

In a further embodiment, illustrated in FIGS. 13 and 14, the noise transfer function NTF(z) (1122 of FIG. 11 or 1222 of FIG. 12) is implemented as an adaptive filter 1310, 1410 and an adaptation circuit 1312, 1412 is used to adapt NTF(z) to match the response of the modulator 1100, 1200 seen by the pseudo-random number sequence PN[n] when the pseudo-random number sequence PN[n] is added to the modulator 1100, 1200. For example, for a second order loop the response of the adaptive filter 1310, 1410 is $NTF(z)=1+c_1 \cdot z^{-1}+c_2 \cdot z^{-2}$, where $c_1$ and $c_2$ are two coefficients to be adapted.

In an embodiment shown in FIG. 13, the adaptation circuit 1312 updates the coefficients $c_1$ and $c_2$ based on exploiting the cross-correlation between the pseudo-random number sequence PN[n] and the modulator output before noise cancellation r[n]. For example, let the pseudo-random number sequence be PN[n] (PN[n]=1 or −1), and the modulator output before noise cancellation be r[n]. Then $c_1$ is approximately $\langle r[n]PN[n-1]\rangle$, and $c_2$ is approximately $\langle r[n]PN[n-2]\rangle$, where $\langle . \rangle$ denotes a statistical average.

In another embodiment shown in FIG. 14, the adaptation circuit 1412 adapts the coefficients $c_1$ and $c_2$ to minimize the mean square value of the output y[n] using a least mean square (LMS) algorithm, and the adaptive filter 1410 is an LMS based adaptive filter. For example, let (new) denote the new or adapted value of the coefficient, and (old) denote the current value of the coefficient. Then $c_1(new)=c_1(old)-\mu*PN[n-1]*y[n]$ and $c_2(new)=c_2(old)-\mu*PN[n-2]*y[n]$, where $\mu$ is an adaptation step size.

For those with ordinary skill in the art, both the LMS scheme and the cross-correlation scheme can be used to other adaptive filters.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A delta-sigma modulator comprising:
   a loop filter to receive an input signal and a feedback signal;
   a quantizer to digitize the output of the loop filter into digital data;
   a pseudo-random number generator to generate a pseudo-random number sequence;
   a summing circuit to adjust the digital data by adding the pseudo-random number sequence to the output of the quantizer;
   a digital-to-analog converter to convert the adjusted digital data into the feedback signal;

a filter block to filter the pseudo-random number sequence, wherein the filter block comprises:
  an adaptive filter to receive the pseudo-random number sequence and at least one adaptive filter coefficient; and
  an adaptation circuit to receive the pseudo-random number sequence and the adjusted digital data, and to update the at least one adaptive filter coefficient based on the cross-correlation between the pseudo-random number sequence and the adjusted digital data.

2. A delta-sigma modulator comprising:
a loop filter to receive an input signal and a feedback signal;
a quantizer to digitize the output of the loop filter into digital data;
a pseudo-random number generator to generate a pseudo-random number sequence;
a summing circuit to adjust the digital data by adding the pseudo-random number sequence to the output of the quantizer;
a digital-to-analog converter to convert the adjusted digital data into the feedback signal;
a filter block to filter the pseudo-random number sequence, wherein the filter block comprises:
  an adaptive filter to receive the pseudo-random number sequence and at least one adaptive filter coefficient; and
  an adaptation circuit to receive the pseudo-random number sequence and the modulator output, and to update the at least one adaptive filter coefficient to minimize the mean square value of the modulator output using a least mean square algorithm; and
a combining circuit to subtract the output of the filter block from the adjusted digital data to produce a modulator output.

3. The modulator of claim 2 wherein the adaptive filter comprises a least mean square based adaptive filter.

4. The modulator of claim 2 wherein the loop filter comprises at least one $1^{st}$ order low-pass filter element that has a modest DC gain.

5. A delta-sigma modulator comprising:
a loop filter to receive an input signal and a feedback signal;
a quantizer to digitize the output of the loop filter into digital data;
a dithering circuit to inject noise into the digital data to create adjusted digital data;
a digital-to-analog converter to convert the adjusted digital data into the feedback signal; and
a noise cancellation circuit to subtract at least a portion of the noise introduced by the injected noise from the adjusted digital data to produce a modulator output, wherein the noise cancellation circuit comprises:
  an adaptive filter to receive the noise and at least one adaptive filter coefficient; and
  an adaptation circuit to receive the noise and the adjusted digital data, and to update the at least one adaptive filter coefficient based on the cross-correlation between the noise and the adjusted digital data.

6. A delta-sigma modulator comprising:
a loop filter to receive an input signal and a feedback signal;
a quantizer to digitize the output of the loop filter into digital data;
a dithering circuit to inject noise into the digital data to create adjusted digital data;
a digital-to-analog converter to convert the adjusted digital data into the feedback signal; and
a noise cancellation circuit to subtract at least a portion of the noise introduced by the injected noise from the adjusted digital data to produce a modulator output, wherein the noise cancellation circuit comprises:
  an adaptive filter to receive the noise and at least one adaptive filter coefficient; and
  an adaptation circuit to receive the noise and the modulator output, and to update the at least one adaptive filter coefficient to minimize the mean square value of the modulator output using a least mean square algorithm.

7. The modulator of claim 6 wherein the adaptive filter comprises a least mean square based adaptive filter.

8. The modulator of claim 6 wherein the dithering circuit injects noise into the modulator before the quantizer.

9. The modulator of claim 6 wherein the dithering circuit injects noise into the modulator after the quantizer.

10. The modulator of claim 6 wherein the loop filter comprises at least one $1^{st}$ order low-pass filter element that has a modest DC gain.

11. The modulator of claim 6 further comprising a summing circuit, wherein the summing circuit subtracts the feedback signal from the input signal.

12. The modulator of claim 6 wherein the noise comprises pseudo-random noise.

13. A method of performing delta-sigma data conversion comprising:
receiving an input signal and a feedback signal;
filtering a combination of the input signal and the feedback signal using a loop filter;
quantizing the output of the loop filter to generate a digital output;
adjusting the digital output by adding a number sequence to the digital output;
generating the feedback signal by converting the adjusted digital output into an analog signal;
filtering the number sequence; wherein filtering the number sequence comprises:
  filtering the number sequence with an adaptive filter having at least one adaptive filter coefficient; and
  updating the at least one adaptive filter coefficient based on the cross-correlation between the number sequence and the adjusted digital output; and
subtracting the filtered number sequence from the adjusted digital output to produce a modulator output.

14. A method of performing delta-sigma data conversion comprising:
receiving an input signal and a feedback signal;
filtering a combination of the input signal and the feedback signal using a loop filter;
quantizing the output of the loop filter to generate a digital output;
adjusting the digital output by adding a number sequence to the digital output;
generating the feedback signal by converting the adjusted digital output into an analog signal;
filtering the number sequence, wherein filtering the number sequence comprises:
  filtering the number sequence with a least mean square based adaptive filter having at least one adaptive filter coefficient; and updating the at least one adaptive filter coefficient to minimize a mean square value of the modulator output using a least mean square algorithm.

15. The method of claim 14 wherein the loop filter comprises at least one $1^{st}$ order low-pass filter element that has a modest DC gain.

16. The method of claim 14 wherein receiving the input signal comprises receiving a continuous-time input signal.

17. The method of claim 14 wherein receiving the input signal comprises receiving a discrete-time input signal.

18. The method of claim 14 further comprising subtracting the feedback signal from the input signal.

19. The method of claim 14 wherein adding the number sequence comprises adding a pseudo-random number sequence.

20. A method of performing delta-sigma data conversion comprising:
   receiving an input signal and a feedback signal;
   filtering a combination of the input signal and the feedback signal using a loop filter;
   quantizing the output of the loop filter to generate a digital output;
   creating an adjusted digital output by adding noise to the digital output;
   generating the feedback signal by converting the adjusted digital output into an analog signal; and
   subtracting at least a portion of the induced noise from the adjusted digital output to produce a modulator output, wherein subtracting the induced noise comprises:
      filtering the noise with an adaptive filter having at least one adaptive filter coefficient;
      updating the at least one adaptive filter coefficient based on the cross-correlation between the noise and the adjusted digital output; and
      subtracting an output of the adaptive filter from the adjusted digital output.

21. A method of performing delta-sigma data conversion comprising:
   receiving an input signal and a feedback signal;
   filtering a combination of the input signal and the feedback signal using a loop filter;
   quantizing the output of the loop filter to generate a digital output;
   creating an adjusted digital output by adding noise to the digital output;
   generating the feedback signal by converting the adjusted digital output into an analog signal; and
   subtracting at least a portion of the induced noise from the adjusted digital output to produce a modulator output, wherein subtracting the induced noise comprises:
      filtering the noise with a least mean square based adaptive filter having at least one adaptive filter coefficient;
      updating the at least one adaptive coefficient to minimize a mean square value of the modulator output using a least mean square algorithm; and
      subtracting an output of the adaptive filter from the adjusted digital output.

22. The method of claim 21, wherein the loop filter comprises at least one $1_{st}$ order low-pass filter element that has a modest DC gain.

23. The method of claim 21, wherein receiving the input signal comprises receiving a continuous-time input signal.

24. The method of claim 21, wherein receiving the input signal comprises receiving a discrete-time input signal.

25. The method of claim 21, further comprising subtracting the feedback signal from the input signal.

26. The method of claim 21, wherein adding noise comprises adding pseudo-random noise.

* * * * *

UNITED STATES PATENT AND TRADEMARK OFFICE
CERTIFICATE OF CORRECTION

PATENT NO. : 7,301,489 B2 Page 1 of 1
APPLICATION NO. : 11/294734
DATED : November 27, 2007
INVENTOR(S) : Chia-Liang Lin It is certified that error appears in the above-identified patent and that said Letters Patent is hereby corrected as shown below:

At column 1, line 50, delete "$1-\alpha<<1$," and insert -- $1-\alpha<<1$), --, therefor.

At column 10, line 27, delete " $\langle .\ \rangle$denotes " and insert -- $\langle .\rangle$ denotes --, therefor.

At column 10, line 61, in Claim 1, delete "generatcr" and insert -- generator --, therefor.

At column 11, line 60, in Claim 5, delete "filler" and insert -- filter --, therefor.

At column 14, line 24 (approx.), in Claim 22, delete "$1_{st}$" and insert -- $1^{st}$ --, therefor.

Signed and Sealed this

Tenth Day of June, 2008

JON W. DUDAS
*Director of the United States Patent and Trademark Office*